US011652091B2

United States Patent
Salvatore et al.

(10) Patent No.: US 11,652,091 B2
(45) Date of Patent: May 16, 2023

(54) SOLID STATE SWITCHING DEVICE INCLUDING NESTED CONTROL ELECTRONICS

(71) Applicant: ABB Schweiz AG, Baden (CH)

(72) Inventors: Giovanni Salvatore, Zollikerberg (CH); Slavo Kicin, Zurich (CH)

(73) Assignee: ABB Schweiz AG, Baden (CH)

( * ) Notice: Subject to any disclaimer, the term of this patent is extended or adjusted under 35 U.S.C. 154(b) by 238 days.

(21) Appl. No.: 16/906,799

(22) Filed: Jun. 19, 2020

(65) Prior Publication Data

US 2021/0398958 A1  Dec. 23, 2021

(51) Int. Cl.
| | | |
|---|---|---|
| H01L 25/16 | (2006.01) | |
| H01L 23/367 | (2006.01) | |
| H01L 25/18 | (2023.01) | |
| H01L 25/00 | (2006.01) | |
| H02H 3/02 | (2006.01) | |
| H01H 71/00 | (2006.01) | |
| H01H 9/52 | (2006.01) | |
| H05K 7/20 | (2006.01) | |
| H02H 3/08 | (2006.01) | |

(52) U.S. Cl.
CPC ............ *H01L 25/165* (2013.01); *H01H 9/52* (2013.01); *H01H 71/00* (2013.01); *H01L 23/3675* (2013.01); *H01L 23/3677* (2013.01); *H01L 25/162* (2013.01); *H01L 25/18* (2013.01); *H01L 25/50* (2013.01); *H02H 3/02* (2013.01); *H05K 7/209* (2013.01); *H02H 3/08* (2013.01)

(58) Field of Classification Search
CPC ........ H02H 3/02; H02H 3/08; H01L 23/3675; H01L 23/3677; H01L 25/162; H01L 25/165; H01L 25/18; H01L 25/50; H05K 7/209

See application file for complete search history.

(56) References Cited

U.S. PATENT DOCUMENTS

| | | | |
|---|---|---|---|
| 5,978,223 A | 11/1999 | Hamilton et al. | |
| 7,265,983 B2 | 9/2007 | Frisch | |
| 9,241,428 B1* | 1/2016 | Doo | H05K 7/1432 |
| 10,447,170 B1* | 10/2019 | Wu | H05K 7/1432 |
| 2005/0078454 A1* | 4/2005 | Hyodo | H05K 7/20854 361/712 |
| 2013/0062751 A1* | 3/2013 | Takagi | H01L 23/3675 257/692 |
| 2016/0064308 A1* | 3/2016 | Yamada | H01L 25/04 257/697 |

(Continued)

*Primary Examiner* — Ahmed N Sefer (74) *Attorney, Agent, or Firm* — Leydig, Voit & Mayer, Ltd.

(57) ABSTRACT

A solid state switching device, such as a solid state circuit breaker, includes at least one heat sink, a control electronics printed circuit board (PCB), and power electronics. The power electronics are useful to regulate the flow of current from one terminal of the solid state switching device to another terminal. The power electronics can include one or more solid state devices such as FETs, Thyristors, Thyristors+SiC JFET in parallel, IGBTs, and IGCTs. The control PCB can include a variety of circuit elements useful to perform the function of a gate driver useful to activate the solid state device of the power electronics. The heat sink includes one or more signal vias formed therethrough to permit nesting of the control PCB within the heat sink.

10 Claims, 5 Drawing Sheets

(56) References Cited

U.S. PATENT DOCUMENTS

2018/0352686 A1* 12/2018 Song .................. H05K 7/20927
2019/0341336 A1* 11/2019 Yoshihara ............. H01L 25/072
2020/0170147 A1*  5/2020 Arai ...................... H01L 23/473

* cited by examiner

SOLID STATE SWITCHING DEVICE INCLUDING NESTED CONTROL ELECTRONICS

TECHNICAL FIELD

The present disclosure generally relates to solid state switching devices, and more particularly, but not exclusively, to solid state circuit breakers having one or more heat sinks.

BACKGROUND

The present disclosure relates generally to power switches such as solid state circuit breakers. Power systems need protection from fault currents that can damage power electronics converters, energy storage systems, capacitor banks, and other devices. Solid state circuit breakers can provide ultra-fast fault protection, load connection, and disconnection for a large variety of power critical applications. Existing solid state circuit breakers suffer from a number of shortcomings and disadvantages. There remain unmet needs including reducing device cost and reducing power losses during non-fault condition operations. For example, conventional solid state circuit breakers are costlier and incur higher conduction losses than traditional electromechanical circuit breakers. In view of these and other shortcomings in the art, there is a significant need for the unique apparatuses, methods, systems and techniques disclosed herein. Some existing systems have various shortcomings relative to certain applications. Accordingly, there remains a need for further contributions in this area of technology.

SUMMARY

One embodiment of the present disclosure is a unique solid state circuit breaker. Other embodiments include apparatuses, systems, devices, hardware, methods, and combinations for positioning control electronics with respect to a heat sink of the solid state circuit breaker. Further embodiments, forms, features, aspects, benefits, and advantages of the present application shall become apparent from the description and figures provided herewith.

DETAILED DESCRIPTION OF THE ILLUSTRATIVE EMBODIMENTS

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

Figure 1:
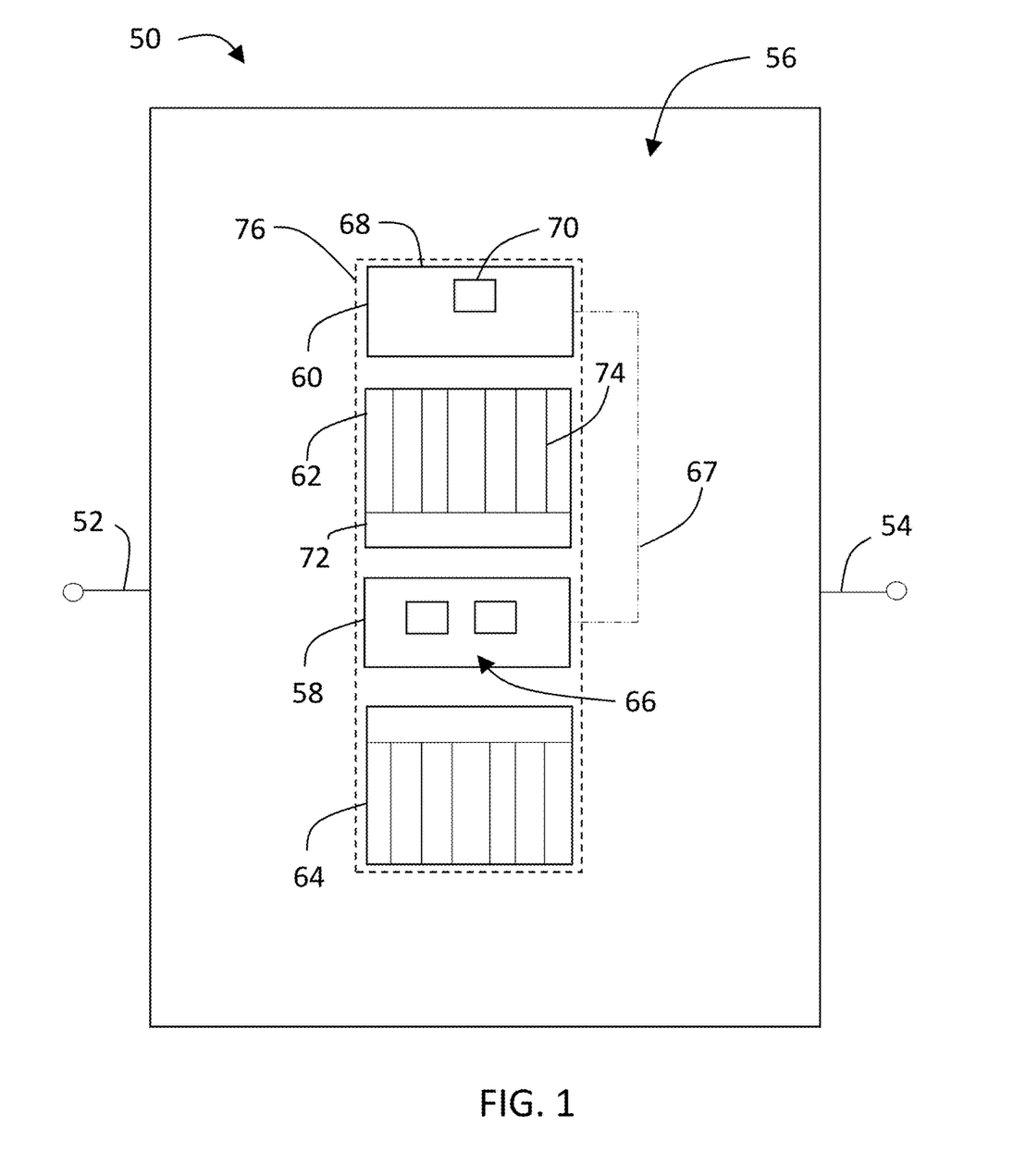
FIG. 1 depicts one embodiment of a solid state switching device.

With reference to FIG. 1, a power switch 50 is illustrated which is useful to regulate (e.g. interrupt) current flow between terminals 52 and 54. In some forms the power switch 50 can take the form of a solid state circuit breaker (SSCB). For convenience of description below, reference will be made to solid state circuit breaker (SSCB) 50, but it will be understood that no limitation is hereby intended that the description below suitable for other types of power switches will nevertheless only be limited to SSBC's. For example, in certain embodiments, SSCB 50 may instead be another type of power switch including a solid state contactor, a status transfer switch, a utility disconnect switch, tie interconnect switch, bypass switch, another type of power switch structured to protect against faults, or another type of power switch structured to couple a power source to a load, to name but a few examples. It will also be appreciated that SSCB 50 may be implemented in a variety of applications, including low voltage DC power distribution systems, medium voltage DC power distribution systems, AC distribution systems, data centers, and shipboard power systems, to name but a few examples. In certain embodiments, low voltage may include any voltage less than 1500 V and medium voltage may include a range of voltages between 1500V and 73 kV.

The SSCB 50 includes the terminals 52 and 54, along with a heat sink and electronics package 56 which includes power electronics 58, control electronics printed circuit board (PCB) 60, as well as heat sinks 62 and 64 useful to remove heat from the power electronics 58. Although two heat sinks 62 and 64 are illustrated, in some forms the SSCB 50 may only include one heat sink. Additionally, in some forms either or both of the heat sinks 62 and 64 that are positioned on opposite sides of the power electronics 58 can include multiple heat sinks that together form a coordinated heat sink for that particular side of the power electronics 58. In those embodiments the heat sinks that together form a coordinated heat sink for a particular side of the power electronics 58 can, but need not, be identical. The components depicted in FIG. 1 can be arranged and stacked in the vertical manner illustrated, but other embodiments may include other ordering and/or location of components. For example, although the control electronics PCB 60 is shown ordered at the top of the stack of components, in some forms the control PCB 60 may be located to the lateral side of at least the power electronics 58.

The power electronics 58 includes a semiconductor switch configuration 66 which can include one or more semiconductor switching elements (two are shown in the schematic for illustrative purposes). The semiconductor switching elements can take a variety of forms including FETs, thyristors, thyristors+SiC JFET in parallel, IGBTs, IGCTs, or any other combinations of these forms, to set forth just a few non-limiting examples. The switching elements 66 are useful to regulate current between the terminals 52 and 54, such as but not limited to interrupting the current flow therebetween. In some non-limiting embodiments the SSCB 50 is bidirectional, so current may flow from terminal 52 to 54, or from terminal 54 to 52. When turned on, current may flow through switching elements 66 in a forward direction but not a rearward direction, and in some forms current can flow in a reverse direction, and in still other forms current can flow in both forward and rearward directions. Orientation of multiple separate switching elements 66 can ensure that current flows from terminal 52 to 54 through at least one of the elements 66, and that current flows from terminal 52 to 54 through at least another of the elements 66. Such a device can have the separate elements 66 in an anti-parallel configuration as will be appreciated by those of skill in the art. An example of such a circuit breaker can be found in U.S. patent application Ser. No. 16/707,426 filed on Dec. 9, 2019 which is hereby incorporated herein by reference in its entirety.

The control PCB 60 is provided to monitor current flow between the terminals 52 and 54, as well as to control the solid state devices 66 of the power electronics 58 to regulate and/or interrupt the current flow. Such monitoring and/or control can occur though a communication link 67 which can take any variety of forms, including but not limited to a pin, lead, or other type of conductive device that electrically connects the control PCB 60 to the power electronics 58 and/or other locations of the SSCB 52. Further forms and functions of the communication link 67 are described further below and as will also be appreciated by those of skill in the art. The control PCB 60 can be comprised of digital circuitry, analog circuitry, or a hybrid combination of both of these types, which can include any variety of conventional circuit elements, solid state devices, etc. In one form the control PCB 60 includes one or more gate drives to activate the solid state elements 66 of the power electronics 58.

The control PCB 60 includes a printed circuit board (PCB) 68 that can be used to mechanically support and interconnect a variety of circuit elements 70 (only one is shown for simplicity but it will be appreciated that the PCB 68 can include other elements 70). The PCB 68 can take a variety of arrangements including single sided (one copper layer), double sided (two copper layers on both sides of a substrate layer), or multi-layer, to set forth just a few non-limiting examples. The PCB 68 can be made from a variety of materials, typically dielectric in nature, which can include cloth and paper impregnated with a thermoset resin. Common substrate materials include phenolic paper, woven fiberglass, polyimide foils, and polyimide-fluoropolymer composite foils.

In some forms, the printed circuit board 68 is relatively flat having a relatively thin thickness and extending in a planar fashion, but not all printed circuit boards need be arranged in this manner. It will be appreciated that the printed circuit board can have a variety of cross-sectional shapes as viewed in the direction of its thickness, including a square, a rectangular, or another polygonal shape. For example, in the schematic shown in FIG. 1 the shape of the PCB 68 is rectangular having a length along its larger dimension and a width along its shorter dimension. A thickness (not illustrated) will be appreciated to extend into the planar view of FIG. 1). In some forms the printed circuit board can be considered to extend along an elongate axis (e.g. along its length and/or width), where such elongate axes are located within the plane of the planar shaped printed circuit board 68. Although the printed circuit board can extend along each of three separate axes, as shown in the side views of the drawings an elongate axis can be considered the axis of extension that includes a larger dimension than the other axis of extension.

The heat sinks 62 and 64 can be attached within the package 56 by soldering, sintering, glued, or screwed into place, among potential others. Furthermore, the heat sinks 62 and 64 can cover the whole area of the power electronics 58, or only part of it. For example, the heat sinks 62 and/or 64 can extend across an entire distance of one dimension of the power electronics 58 (e.g. its width), but fail to extend across an entire distance of another dimension of the power electronics 58 (e.g. its length).

The heat sinks 62 and 64 can be made of a variety of materials using a variety of different manufacturing processes. For example, the heat sinks 62 and/or 64 can be made of a thermally conductive material such as a metal or polymer. In one form illustrated further below the heat sinks 62 and 64 can include a base from which extends a number of separate heat sink fins 74. The heat sinks 62 and 64 can be made by bonding heat sink fins to a base, the fins can be folded into shape and bonded/brazed/soldered to the base, the fins can be stamped and encapsulated with a die cast base, the heat sink can be forged into shape, fins can be skived onto the base, in the fins can be machined from a stock piece of material to form an integral base and fins, the fins can be CNC machined, the fins can be extruded, etc, etc. When installed the base 72 of the heat sink 64 can extend in parallel with the power electronics package 58 as illustrated in FIG. 1. In one form depicted in FIG. 1 the base 72 extends in parallel with the power electronics package 58, with the base 72 having consistent thickness along the length and/or width of the heat sink, but not all forms of the heat sinks need include a constant thickness base 72. Thus, the base 72 of the heat sink can include an elongate axis of extension as illustrated in FIG. 1 which can be either its length or its width. Although the printed circuit board can extend along each of three separate axes, as shown in the side views of the drawings an elongate axis can be considered the axis of extension that includes a larger dimension than the other axis of extension.

The fins can take a variety of forms such as pins, foils, and columns. In this regard, the fins 74 can have common cross sectional shapes along their respective lengths, but not all embodiments of the heat sinks need have common shapes in all of their respective fins 74. Two or more different shapes are also contemplated for the fins 74 in any given heat sink.

In some forms the fins 74 can be spaced apart equally along a dimension of the base (e.g. along its length and/or width), but not all forms need include equi-spaced fins. In still other forms, the fins may be equi-spaced in one portion of the heat sink, while an open space is provided for in another portion of the heat sink which is unoccupied by finds. Furthermore, the heat sinks 62 and 64 need not be made from the same materials and/or need not be made using the same manufacturing process. In short, the heat sinks 62 and 64 can be different from one another.

Figure 2:
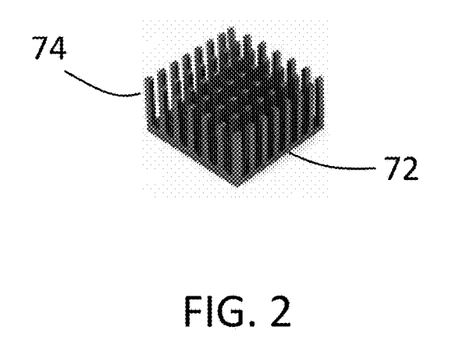
FIG. 2 depicts one embodiment of a heat sink.

The fins 74 can extend to a vertical height above the base 72 of the heat sink. In some forms, all of the fins 74 can extend to a common height above the base, but in other forms the fins can extend to two or more different heights above the base 72. One nonlimiting embodiment of a heat sink is depicted in FIG. 2 which illustrates several fins 74 extending from a base 72.

In general, the heat sink and electronics package 56 is defined by a package envelope 76 which denotes the volumetric space occupied by the components of the package. The dotted line in FIG. 1 identified by reference numeral 76 is notional only and is used for illustration purposes only in FIG. 1. The dotted line 76 does not reflect the actual volumetric envelope of the package 56 in FIG. 1 as will be appreciated, but nevertheless the concept still applies that an envelope can be identified which encompasses the constituent parts of the package 56. As will be appreciated by the embodiments discussed further below, some forms of the package 56 can be minimized by appropriate relative location and orientation of the constituent components (e.g. power electronics 58 control PCB 60, heat sinks 72 and/or 74) which reduces at least one of a width, height, or depth of the package. In the various forms the control electronics PCB 60 can be mounted in close proximity to one or both of the heat sinks such that a space which is occupied by the heat sink and electronics package 56 is minimized.

Figure 3A:
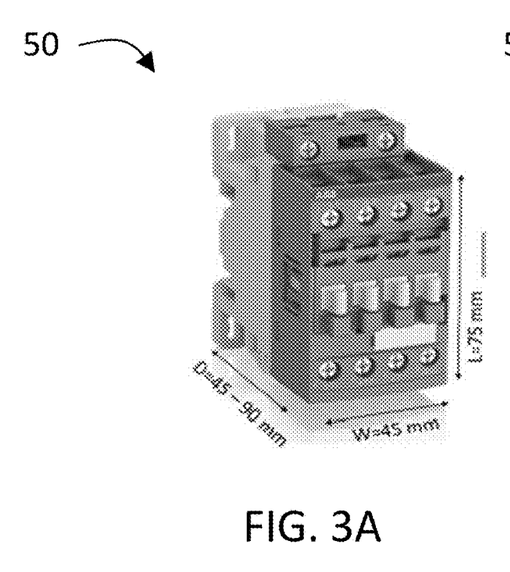
FIGS. 3A and 3B depict embodiments of solid state circuit breakers.
Figure 3B:
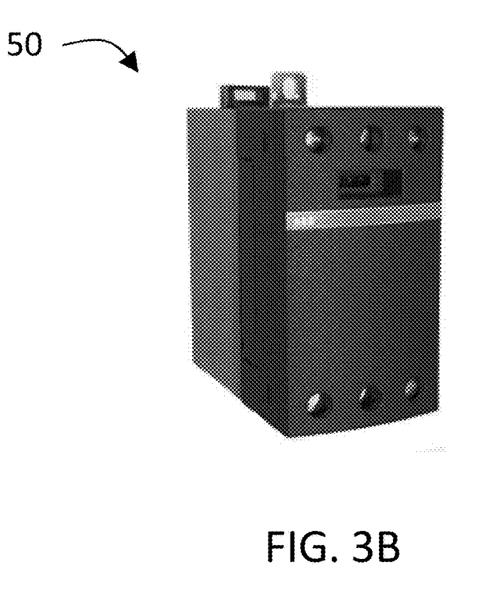

FIGS. 3A and 3B illustrate two different non-limiting embodiments of the SSCB 50 discussed herein. Dimensions are provided for the embodiment illustrated in FIG. 3A, but it will be appreciated that other embodiments may have different dimensions. It will be understood that the embodiments include an outer housing, and wherein the heat sink and electronics package 56 is located at least partially within the outer housing (in some embodiments may be located entirely within the outer housing).

In applications having specific requirements in terms of space and dimensions, the development of a solid state breaker involves a challenge to design a device with miniaturized physical format and able to operate at high currents. The control PCB 60 can be arranged variety of different orientations relative to the power electronics 58, relative to the heat sinks 62 and/or 64, and/or relative to the overall volumetric dimensions of the heat sink and electronics package 56. Dimensions of the heat sink and electronics package 56 are such that the package envelope 76 is minimized to reduce one or more dimensions of the package and/or reduce volumetric requirements needed for incorporation into the electronic switching device 50. The package dimensions can include a height, width, and depth defined by the various portions of the package. For example, the heat sink fans extending from a base of the top heat sink can define one edge, and the heat sink fans extending from a base of the bottom heat sink can define another edge, where the distance between those two edges defines the height of the package. Various attributes of the package can be derived from these constraints. For example, the heat sink and electronics package can be sized such that an upper portion of the control electronics does not extend further than an upper portion of the top heat sink.

Figure 4:
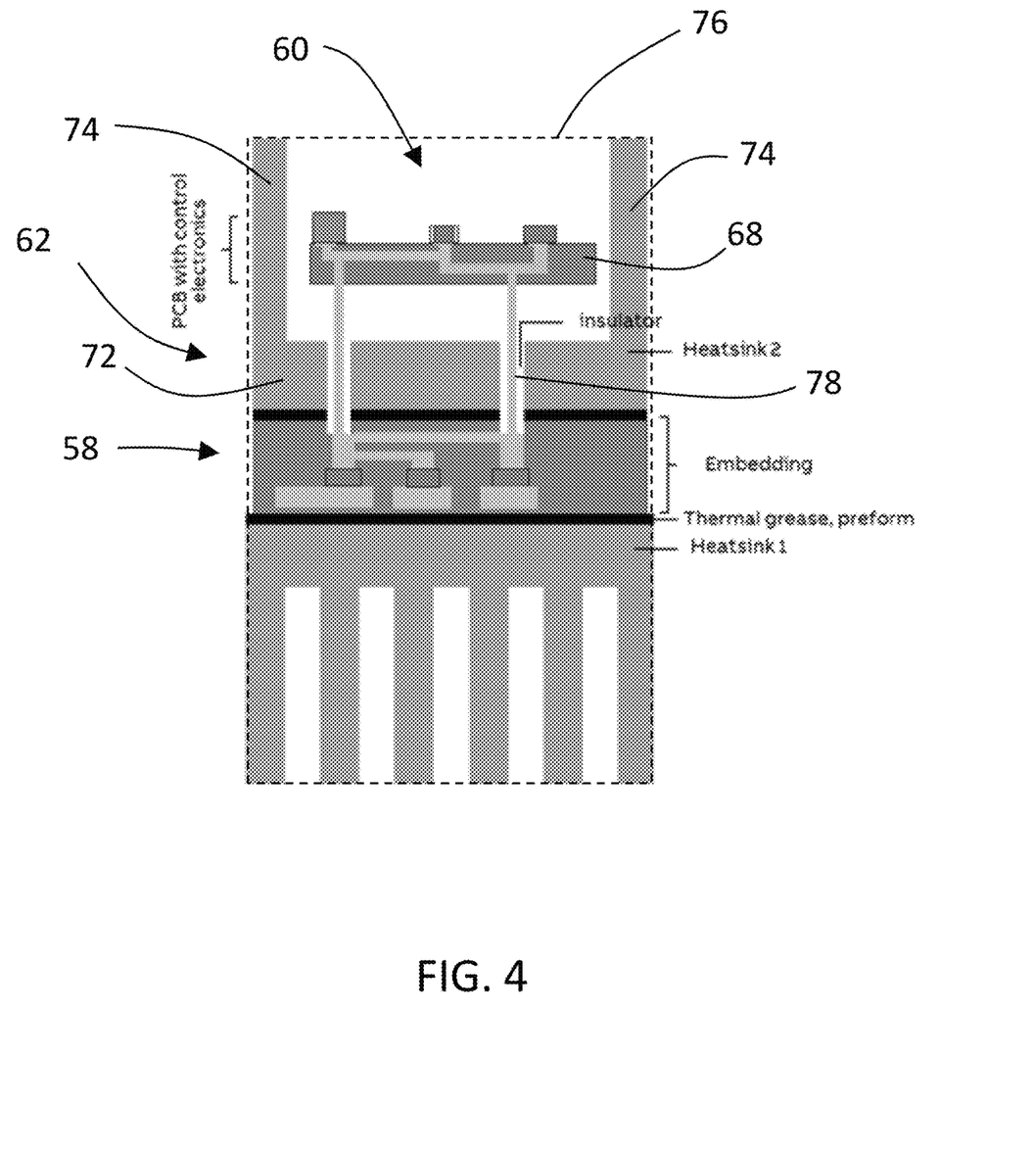
FIG. 4 depicts an embodiment of a solid state switching device.

Turning now to FIG. 4, one embodiment of the heat sink and electronics package 56 is illustrated which includes the control PCB 60 positioned between laterally spaced heat sink fins 74. The control PCB 60 is shown nested between two laterally spaced fins 74 on either side of the control PCB 60, but it will be appreciated that the control PCB 60 can also be bounded by additional heat sink fins 74 that are distributed into and out of the page if the fins 74 are in the form of separate fins depicted in a matrix arrangement such as those illustrated in FIG. 2. It will also be understood that in some embodiments one or more fins can be distributed across the front of the image depicted in FIG. 4 and on an opposite side of the control PCB 60 in those embodiments in which the control PCB 60 is positioned interior of a set of fins 74 distributed around the periphery of the control PCB 60. In short, there are several different arrangements in which two or more heat sink fins can surround the PCB 60.

The control PCB 60 as shown is mounted horizontally with respect to the heat sink 62. As used herein, the terms "vertical" and "horizontal" are used for ease of description and are not intended to convey precise limitations in an as-installed configuration of the SSCB 50. In the embodiment shown in FIG. 4 the PCB 68 is aligned parallel with the base 72 of the heat sink 62, but in other forms the PCB 68 can be arranged at an angle, including at a 90 degree angle (e.g. see FIG. 5).

The control PCB 60 can be connected to the power electronics 58 through one or more pins, leads, other similar devices depicted as reference numeral 78 which serve as the communications link 67 described above. The following discussion will refer to numeral 78 as a pin, but it will be appreciated that any conductive device connects the control PCB 60 to power electronics 58 is contemplated herein. The pins 78 can have a variety of thickness and configurations and are shown as extending through the heat sink 62 through signal vias 80 formed in the heat sink. The pins 78 are shown in electrical conductive communication with one or more circuit paths illustrated in the figure in both the control PCB 60 and the power electronics 58.

The control PCB 60 can be offset from the heat sink 62 to provide some measure of insulation from the heat sink 62, fins 74, and/or base 72. In some forms the pins 78 are used to structurally support the control PCB 60 and provide an air gap offset from the base 72. In some forms a physical insulator can be disposed between the control PCB 60 and the power electronics 58 in lieu of and/or additional to an air gap.

The embodiment in FIG. 4 also includes thermal grease disposed between the power electronics 58 and each of the heat sinks 62 and 64 to serve as a thermally conductive but electrically insulative material. The thermal grease can be used to bond the heat sinks to the power electronics. The thermal grease is used to eliminate air gaps or spaces from the interface area between the power electronics 58 and either of the sinks 62 and 64. Some forms of the SSCB 50 need not include such a material. For example, in some forms screws can be used to attach the heat sinks to the power electronics.

Figure 5:
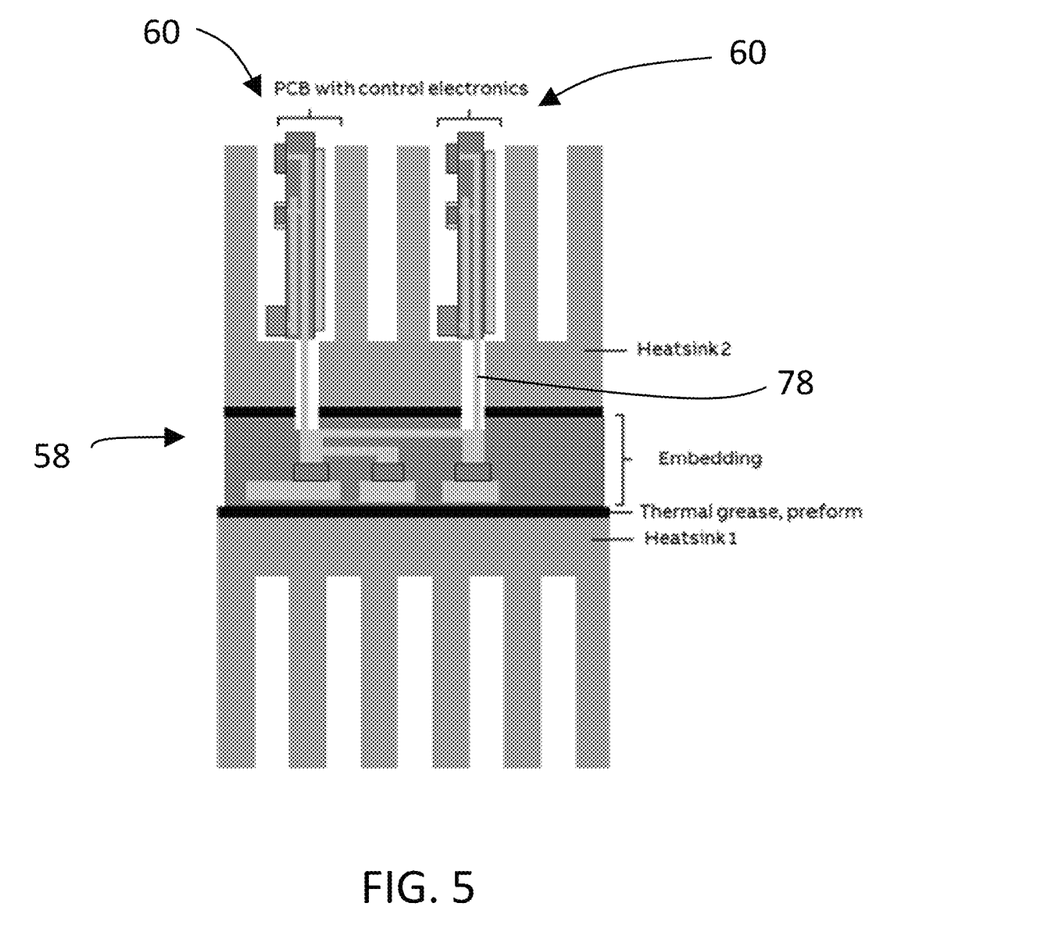
FIG. 5 depicts another embodiment of a solid state switching device.

FIG. 5 depicts yet another embodiment wherein multiple separate control PCBs 60 are used to communicate and/or control the power electronics 58. The control PCBs 60 can be configured to each control a gate driven solid state device of the power electronics 58. The PCBs 60 are each nested between neighboring fins 74. The control PCBs 60 as shown are mounted vertically with respect to the heat sink 62. In the embodiment shown in FIG. 5 the PCBs 68 are aligned perpendicular with the base 72 of the heat sink 62, but in other forms the PCB 68 can be arranged at other angles, including parallel with the base 72.

In some forms the separate PCBs 60 can be positioned next to each other with fins 74 positioned on the outer sides (e.g. an embodiment in which the interior fins 74 depicted between the PCBs 60 in FIG. 5 are removed. The fins 74 can be positioned about the various PCBs 60 in similar fashion as the embodiments described above (e.g. extending around the periphery of either or both of the PCBs 60). In some forms the PCBs 60 can be identical, but not all forms need include identical PCBs 60. It will be appreciated that the envelope 76 extends to the top of the PCBs 60 in FIG. 5, which project above the top of the fins 74. In some forms one or both of the PCBs 60 in FIG. 5 are located wholly below the top of the fins 74. It will also be appreciated that the thin dimension of the PCB 68 (i.e. the thickness) is illustrated in FIGS. 4 and 5, in which the length and depth of the PCB 68 extend into and/or out of the page. Thermal grease is disposed in FIG. 5 as in FIG. 4, but in some forms it need not be present. Also as will be understood, the pins 78 are shown in electrical conductive communication with one or more circuit paths illustrated in the figure in both the control PCB 60 and the power electronics 58.

Figure 6:
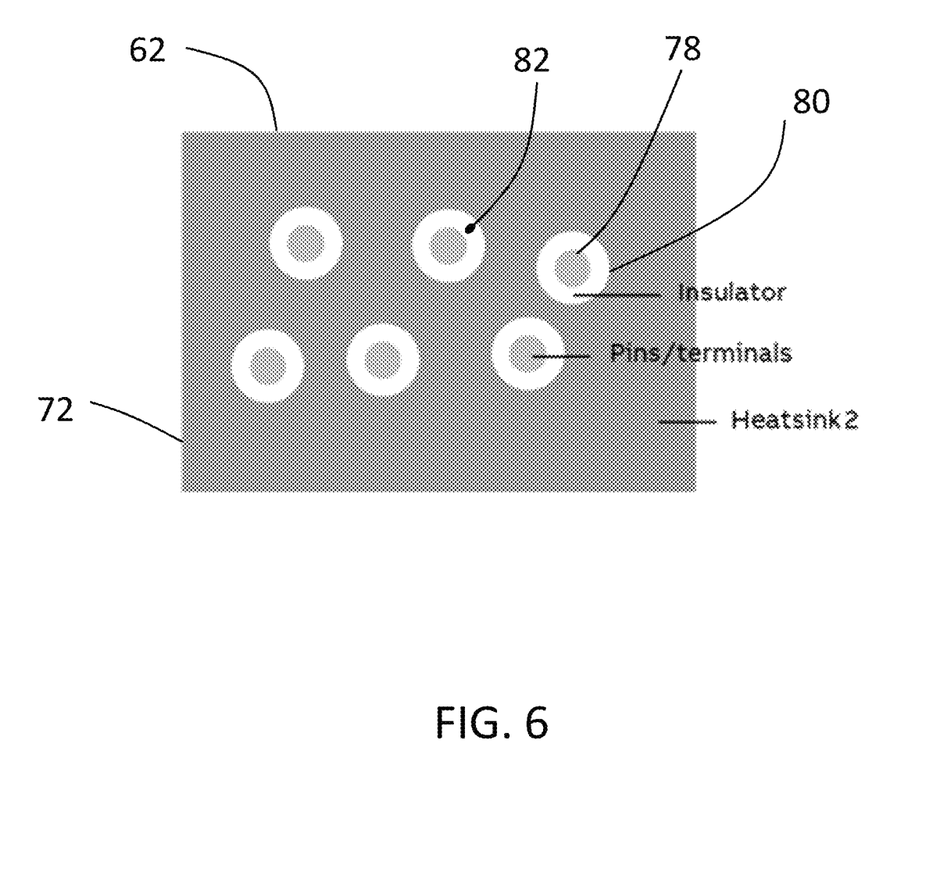
FIG. 6 depicts an embodiment of signal vias formed through a heat sink.

FIG. 6 depicts an embodiment of the pins 78 passing through the signal vias 80 formed in the heat sink 62. The signal vias 80 can take any variety of different shapes having any variety of different cross sectional sizes. In some forms an insulator 82 is disposed between the pins 78 and a wall of the signal via 80. The insulator 82 can be both an electric insulator, and in some forms can additionally be a thermal insulator. As in the discussion of the air gap used above as an insulator, the insulator 82 can be air, polymers/gels, among potential others. The insulator 82 can be installed after insertion of the pin 78, but in some embodiments the pin 78 can be pre-insulated and then inserted into the signal via 80.

One manner of constructing the package 56 of any of the embodiments disclosed herein includes attaching one or more heat sinks to the power electronics 58, inserting pins 78 through the signal vias 80, and connecting the control PCB 60 to the power electronics 58. The pins 78 can be pre-connected to either of the power electronics 58 or the control PCB 60 prior to being inserted into the vias 80.

One aspect of the present application includes an apparatus comprising a solid state current interrupting device having a first power terminal and a second power terminal, the solid state current interrupting device includes: a power electronics module having at least one solid-state component useful to regulate flow of current between the first power terminal and second power terminal; a heat sink positioned in thermal contact with the power electronics module such that heat generated from the power electronics module is dissipated through the heat sink, the heat sink having a signal via formed in the heat sink and which extends from a first side of the heat sink to a second side of the heat sink; and a control electronics printed circuit board structured to provide a control signal to the at least one solid-state component of the power electronics module; wherein the power electronics multiple is located on the first side of the heat sink, wherein the controller electronics printed circuit board is located on the second side of the heat sink, and wherein a signal carrying conductive lead is positioned in the signal via and is electrically connected to the control electronics printed circuit board on one end and the power electronics on an opposing end of the signal carrying conductive lead.

A feature of the present application includes wherein the at least one solid-state component is a gate driven component useful to halt current.

Another feature of the present application includes wherein the at least one solid-state component is in the form of one of a FET, thyristor, an IGBT, and an RB-IGCT, and wherein the solid-state current interrupting device is a solid state circuit breaker.

Yet another feature of the present application includes wherein the heat sink includes a plurality of heat sink fins that extend from a base of the heat sink, wherein the heat sink includes a heat sink fin on a first lateral side of a heat sink, and the heat sink includes a second heat sink fin on an opposing second lateral side of the heat sink, and wherein the control electronics printed circuit board is positioned between the first heat sink fin and a second heat sink fin.

Still another feature of the present application includes wherein each of the plurality of control electronics printed circuit boards are each arranged between neighboring heat sink fins of the plurality of heat sink fins.

Yet still another feature of the present application includes wherein the control electronics printed circuit board includes a top surface and a bottom surface, the bottom surface of the control electronics printed circuit board offset from the heat sink such that transmission of thermal energy is discouraged from the heat sink to the control electronics printed circuit board.

Still yet another feature of the present application includes wherein a thermal insulator is disposed between the control electronics printed circuit board and the heat sink.

A further feature of the present application includes wherein the signal carrying conductive lead positioned in the signal via is in the form of one of a pin and a terminal.

A yet further feature of the present application includes wherein the signal carrying conductive lead is isolated from the heat sink by an electric insulator.

A still yet further feature of the present application includes wherein the signal carrying conductive lead is configured to structurally support the control electronics printed circuit board such that the offset formed from the heat sink is maintained through the signal carrying conductive lead.

Another aspect of the present application includes an apparatus comprising a solid state circuit breaker structured to monitor current flow in a circuit connection between a power input and a power output, the solid state circuit breaker including a heat sink and electronics package which includes: a power electronics module including at least one switchable solid-state component, a heat sink having a plurality of laterally spaced heat sink fins extending from a base of the heat sink, and a control electronics printed circuit board configured to monitor current flow between the power input and power output and issue a control signal to the at least one switchable solid-state component to open the circuit connection, wherein at least a majority of the volume of the control electronics printed circuit board is positioned between two of the laterally spaced heat sink fins and is vertically located between at least one tip of the laterally spaced heat sink fins and the base.

A feature of the present application includes wherein the heat sink includes a signal via formed through a thickness of the heat sink, and wherein a signal carrying conductive lead is positioned in the signal via and is electrically connected to the control electronics printed circuit board and the power electronics module.

Another feature of the present application includes wherein the control electronics printed circuit board includes an elongate axis of extension which is oriented parallel with the base of the heat sink.

Still another feature of the present application includes wherein the base of the heat sink extends along a base axis perpendicular to an axis of extension of wherein the control electronics printed circuit board includes an elongate axis of extension which is oriented at an angle relative to the base of the plurality of laterally spaced heat sink fins.

Yet another feature of the present application includes wherein the heat sink and electronics package is defined by a height, a width, and a depth, wherein the control electronics printed circuit board is positioned such that it resides wholly within the height, width, and depth of the heat sink and electronics package.

Still yet another feature of the present application includes wherein the heat sink includes a plurality of signal vias formed through the thickness of the heat sink, and wherein the solid state current interrupting device includes a plurality of control electronics printed circuit boards coupled each with the power electronics module.

Yet still another feature of the present application includes wherein the heat sink and electronics package includes a plurality of control electronics printed circuit boards.

Still yet another feature of the present application includes wherein each of the plurality of control electronics printed circuit boards resides between respective neighboring fins of the plurality of laterally spaced heat sink fins.

A further feature of the present application further includes a plurality of signal vias formed through a thickness of the heat sink.

A yet further feature of the present application includes wherein the heat sink and electronics package includes another heat sink positioned adjacent to the power electronics module opposite the heat sink having the plurality of laterally spaced heat sink fins.

Yet another aspect of the present application includes a method comprising: attaching a first heat sink to a power electronics module, the first heat sink including a signal via formed therethrough; nesting a control electronics printed circuit board between laterally spaced fins of the heat sink, the laterally spaced fins extending from a base of the heat sink; positioning a signal carrying conductive lead in the signal via of the first heat sink; and electrically connecting the control electronics printed circuit board to the power electronics module with the signal carrying conductive lead.

A feature of the present application further includes attaching a second heat sink to the power electronics module opposite the first heat sink, the second heat sink including a plurality of second heat sink fins.

Another feature of the present application further includes insulating the signal carrying conductive lead from the base of the heat sink.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

What is claimed is:

1. An apparatus, comprising:
    a solid state current interrupting device having a first power terminal and a second power terminal, the solid state current interrupting device comprising:
        a power electronics module having at least one solid-state component configured to regulate flow of current between the first power terminal and second power terminal;
        a heat sink positioned in thermal contact with the power electronics module such that heat generated from the power electronics module is dissipated through the heat sink, the heat sink having a signal via formed in the heat sink and which extends from a first side of the heat sink to a second side of the heat sink; and
        at least one control electronics printed circuit board configured to provide a control signal to the at least one solid-state component of the power electronics module,
    wherein the power electronics module is located on the first side of the heat sink,
    wherein the at least one control electronics printed circuit board is located on the second side of the heat sink, and
    wherein a signal carrying conductive lead is positioned in the signal via and is electrically connected to the at least one control electronics printed circuit board on one end and the power electronics on an opposing end of the signal carrying conductive lead.

2. The apparatus of claim 1, wherein the at least one solid-state component is a gate driven component configured to halt current.

3. The apparatus of claim 2, wherein the at least one solid-state component comprises a FET, thyristor, an IGBT, and an RB-IGCT, and
    wherein the solid-state current interrupting device comprises a solid state circuit breaker.

4. The apparatus of claim 1, wherein the at least one control electronics printed circuit board includes a top surface and a bottom surface, the bottom surface of the at least one control electronics printed circuit board offset from the heat sink such that transmission of thermal energy is discouraged from the heat sink to the at least one control electronics printed circuit board.

5. The apparatus of claim 1, wherein a thermal insulator is disposed between the at least one control electronics printed circuit board and the heat sink.

6. The apparatus of claim 1, wherein the signal carrying conductive lead positioned in the signal via at least one of one of a pin or a terminal.

7. The apparatus of claim 6, wherein the signal carrying conductive lead is isolated from the heat sink by an electric insulator.

8. The apparatus of claim 6, wherein the signal carrying conductive lead is configured to structurally support the at least one control electronics printed circuit board such that the offset formed from the heat sink is maintained through the signal carrying conductive lead.

9. An apparatus, comprising:
    a solid state current interrupting device having a first power terminal and a second power terminal, the solid state current interrupting device comprising:
        a power electronics module having at least one solid-state component configured to regulate flow of current between the first power terminal and second power terminal;
        a heat sink positioned in thermal contact with the power electronics module such that heat generated from the power electronics module is dissipated through the heat sink, the heat sink having a signal via formed in the heat sink and which extends from a first side of the heat sink to a second side of the heat sink; and
        at least one control electronics printed circuit board configured to provide a control signal to the at least one solid-state component of the power electronics module,
    wherein the power electronics module is located on the first side of the heat sink,
    wherein the at least one controller electronics printed circuit board is located on the second side of the heat sink,
    wherein a signal carrying conductive lead is positioned in the signal via and is electrically connected to the at least one control electronics printed circuit board on one end and the power electronics on an opposing end of the signal carrying conductive lead, wherein the heat sink includes a plurality of heat sink fins that extend from a base of the heat sink, wherein the heat sink includes a heat sink fin on a first lateral side of a heat sink, and the heat sink includes a second heat sink fin on an opposing second lateral side of the heat sink, and wherein the control electronics printed circuit board is positioned between the first heat sink fin and a second heat sink fin.

10. The apparatus of claim 9, wherein the at least one control electronics printed circuit board comprises a plurality of control electronics printed circuit boards, and wherein each control electronics printed circuit board of the plurality of control electronics printed circuit boards is arranged between neighboring heat sink fins of the plurality of heat sink fins.

* * * * *